United States Patent [19]

Kawakami et al.

[11] Patent Number: 5,220,135
[45] Date of Patent: Jun. 15, 1993

[54] PRINTED WIRING BOARD HAVING SHIELDING LAYER

[75] Inventors: Shin Kawakami; Satoshi Haruyama; Hirotaka Okonogi, all of Saitama, Japan

[73] Assignee: Nippon CMK Corp., Japan

[21] Appl. No.: 493,897

[22] Filed: Mar. 15, 1990

[30] Foreign Application Priority Data

Mar. 15, 1989 [JP] Japan ................................ 1-62689

[51] Int. Cl.$^5$ ............................................. H05K 1/00
[52] U.S. Cl. .................................. 174/264; 174/35 R; 174/255; 428/901
[58] Field of Search ................ 174/35 R, 265, 264, 174/36, 250, 251, 255, 257, 258, 262, 263, 266; 428/901; 29/830; 427/96, 97; 361/397, 398

[56] References Cited

U.S. PATENT DOCUMENTS

| | | | |
|---|---|---|---|
| 4,383,363 | 5/1983 | Hayakawa | 174/264 X |
| 4,801,489 | 1/1989 | Nakagawa | 174/35 R X |
| 4,804,575 | 2/1989 | Kohm | 428/901 X |
| 4,973,799 | 11/1990 | Soma et al. | 174/260 |

*Primary Examiner*—Leo P. Picard
*Assistant Examiner*—Trinidad Korka
*Attorney, Agent, or Firm*—Bruce L. Adams; Van C. Wilks

[57] ABSTRACT

A printed wiring board having a shielding layer for use in an integrated circuit is disclosed. The printed wiring board comprises an insulating sheet having a connecting through hole portion, a printed wiring circuit provided on one or both surfaces of the insulating sheet, an insulating layer having a thickness of 20~50 μm which is provided on the printed wiring circuit, and an electromagnetic shielding layer provided on the insulating layer.

11 Claims, 1 Drawing Sheet

PRINTED WIRING BOARD HAVING SHIELDING LAYER

BACKGROUND OF THE INVENTION

The present invention relates to a printed wiring board having a shielding layer.

A printed wiring board having an electromagnetic wave shielding layer provided on an insulating layer is well known from Japanese Patent Laid-open No. 213,192/87. The printed wiring board 9 disclosed in this Japanese Patent Laid-open comprises, as shown in FIG. 3, an insulating sheet 1, printed wiring circuits 2 formed on both surfaces of the insulating sheet 1, an insulating layer 4 provided on a part of the printed wiring circuits 2, an electromagnetic wave shielding layer 5 provided on the insulating layer 4 and a part of the printed wiring circuit 2 and a solder resist layer 6 provided on the shielding layer 5.

The printed wiring board 9 further comprises a connecting through hole portion 7 including a plated through hole 8 provided in the insulating sheet 1, so that the connecting through hole portion 7 and a component connecting land (not shown) are not covered with the electromagnetic wave shielding layer 5.

In such a conventional printed wiring board 9 having the electromagnetic wave shielding layer 5, the shielding layer 5 does not cover the connecting through hole portion 7, so that the electromagnetic wave of passive noise or active noise affects on the printed wiring circuit through the connecting through hole portion 7.

Moreover, provision of the connecting through hole portion 7 including component connecting land (not shown) leads to a division or discontinuity of the electromagnetic wave shielding layer 5, so that an effective area of the shielding layer becomes decreased and thus sufficient shielding effect cannot be obtained.

In order to obtain an effective shielding effect in the printed wiring board 9 having such a shielding layer 5, a thickness of the insulating layer 4, which is provided between the printed wiring circuit 2 and the shielding layer 5 must also be chosen.

If the thickness of the insulating layer 4 is thin, the withstand voltage characteristic and the insulating characteristic of the insulating layer becomes decreased, so that the printed wiring circuit 2 is short-circuited, thereby harming the operating property of the printed wiring circuit 2 resulting in a decrease of the printed wiring board in quality as a product. If the thickness of the insulating layer 4 is thick, on the contrary, unevenness, or a differential step is caused between the printed wiring circuit 2 and the shielding layer 5, so that a connection to a grounded circuit 5a provided therebetween fails.

SUMMARY OF THE INVENTION

It is an object of the present invention to overcome the above disadvantages of the conventional printed wiring board.

It is another object of the present invention to provide a printed wiring board having sufficient electromagnetic wave shielding effect.

According to the present invention, there is provided a printed wiring board comprising an insulating sheet having a connecting through hole portion, a printed wiring circuit provided on one or both surfaces of the insulating sheet, an insulating layer having a thickness of 20~50 $\mu$m which is provided on the printed wiring circuit, and an electromagnetic shielding layer provided on the insulating layer.

According to the printed wiring board of the present invention, a printed wiring board comprises an insulating sheet having a connecting through hole portion, a printed wiring circuit provided on one or both surfaces of the insulating sheet, an insulating layer having a thickness of 20~50 $\mu$m which is provided on the printed wiring circuit, and an electromagnetic shielding layer provided on the insulating layer, so that sure operation of the printed wiring circuit and sure shielding operation may be obtained and thus unevenness between the printed circuit and the shielding layer may be minimized and good connection to the grounded circuit may be provided therebetween.

The electromagnetic shielding layer is constructed by a sealing member of heat-resistant material or weather-resistant material which is filled or patched in the connecting through hole portion of the printed wiring circuit and through the insulating layer. The sealing member is a thermosetting synthetic resin or a photosetting synthetic resin. The sealing member is a conductive synthetic resin including carbon, silver, copper or the like, thereby connecting printed wiring circuit provided on both surfaces of the insulating sheet.

DETAILED EXPLANATION OF THE PREFERRED EMBODIMENT

Figure 1:
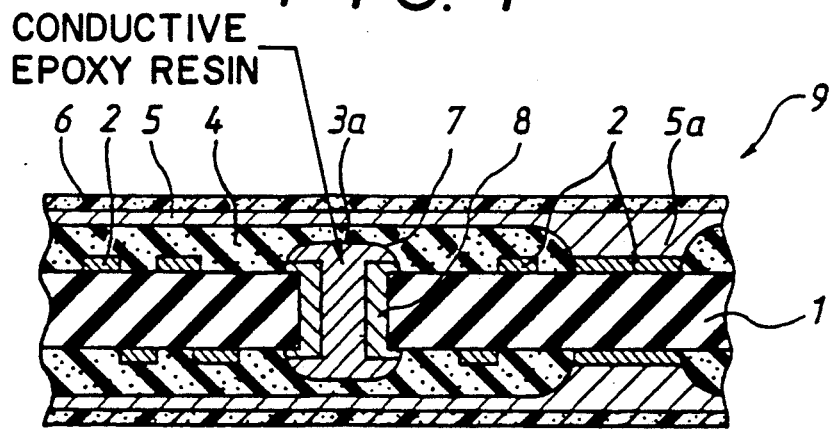
FIG. 1 is an enlarged cross-sectional view showing one embodiment of a printed wiring board according to the present invention.

Now to the drawing, there is shown one embodiment of a printed wiring board according to the present invention.

Figure 2:
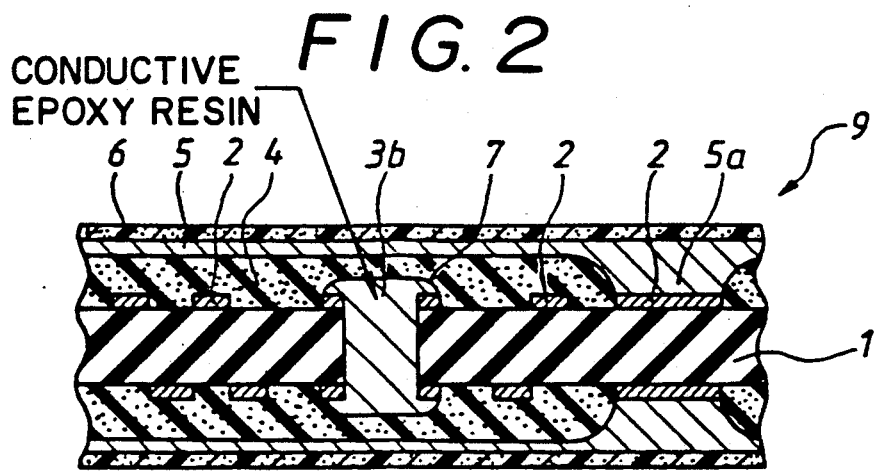
FIG. 2 is an enlarged cross-sectional view showing another embodiment of a printed wiring board according to the present invention, and p
Figure 3:
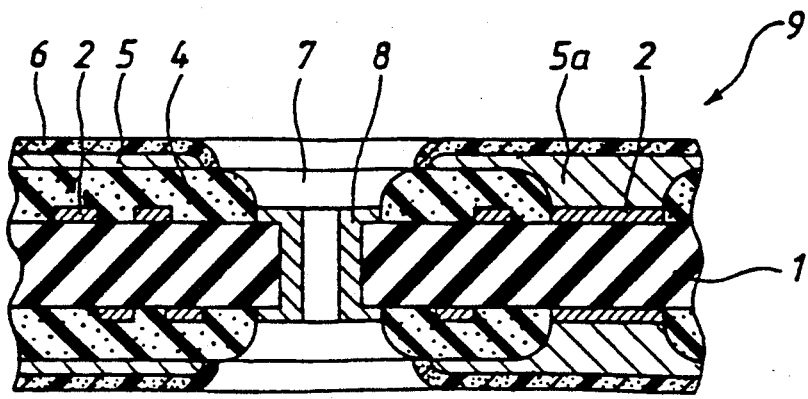
FIG. 3 is an enlarged cross-sectional view showing a conventional printed wiring board.

In FIGS. 1, 2 and 3, corresponding components are given the same reference numerals.

FIG. 1 is an enlarged cross-sectional view partially showing one embodiment of a printed wiring board according to the present invention. Reference numeral 1 is an insulating sheet having at its both sides printed wiring circuits 2 of given pattern which are connected to each other by a plated through hole 8.

Reference numeral 3a is a sealing member filled in a connecting through hole portion 7. The sealing member 3a consists of a heat-resistant material or a weather-resistant material, such as a thermosetting synthetic resin of epoxide (epoxy) resin or the like or a photosetting synthetic resin of acrylic epoxy resin or the like. The sealing member 3a is formed by filling a conductive paste of the above described synthetic resin in respective connecting through hole portions 7 by a screen printing means, and the by hardening the conductive assets.

An insulating layer 4 is provided on a part of the printed wiring circuits 2 and the sealing member 3a by screen printing means, and an electromagnetic wave shielding layer 5 is provided on the insulating layer 4 and a part of the printed wiring circuit 2, and finally a solder resist layer 6 is provided on the electromagnetic wave shielding layer 5. The solder resist layer 6 serves also as protection layer for the shielding layer 5.

Particularly, the thickness of the insulating layer 4 may be 20~50 μm.

In FIGS. 1 to 3, reference numeral 5a indicates a grounded circuit of the printed wiring circuit 2 and the shielding layer 5.

FIG. 2 is a partial enlarged cross-sectional view showing another embodiment of a printed wiring board according to the present invention.

In this embodiment, the printed wiring board 9 comprises a sealing member 3b consisting of a conductive synthetic resin material which includes carbon, silver, copper or the like, so that the printed wiring circuits 2 provided on both sides of the insulating sheet 1 may be connected by the conductive sealing member 3b and thus the connecting through hole portion 7 need not be subjected to a plating process. That is, the plated through hole 8 may be omitted.

The other construction of the printed wiring board 9 of FIG. 2 is the same as that of the printed wiring board 9 shown in FIG. 1, so that its detailed explanation is omitted.

According to the printed wiring board of the present invention, in the double-sided printed wiring board or multilayer printed wiring board, the sealing member of heat-resistant material or weather-resistant material is filled in the connecting though hole portion, and the electromagnetic wave shielding layer is provided on the connecting through hole and the printed wiring circuits with the interposition of the insulating layer (without a grounded wiring circuit), so that electromagnetic waves of passive noise or active noise on the printed wiring board can be prevented even at the connecting through hole portion.

Moreover, the electromagnetic wave shielding layer is not divided at the connecting through hole portion, thereby obtaining a large effective area of the shielding layer, so that the printed wiring board with very sufficient electromagnetic wave shielding effect can be obtained.

It is further understood by those skilled in the art that the foregoing description is a preferred embodiment of the disclosed device and that various changes and modifications may be made in the invention without departing from the spirit and scope thereof.

What is claimed is:

1. A printed wiring board comprising: an insulating sheet having a connecting through hole portion, a printed wiring circuit provided on at least one surface of the insulating sheet, an insulating layer having a thickness of 20~50 μm provided on the printed wiring circuit, and an electromagnetic shielding layer provided on the insulating layer.

2. A printed wiring board as claimed in claim 1, further comprising a sealing member composed of heat-resistant material disposed in the connecting through hole portion of the printed wiring circuit and covered by the insulating layer.

3. A printed wiring board as claimed in claim 2, wherein the sealing member is composed of a thermosetting synthetic resin.

4. A printed wiring board as claimed in claim 2, further comprising a printed wiring circuit on top and bottom surfaces of the insulating sheet, and wherein the sealing member is a conductive synthetic resin including one of carbon, silver and copper for connecting the printed wiring circuits on both the top and bottom surfaces of the insulating sheet.

5. A printed wiring board as claimed in claim 1, further comprising a sealing member composed of weather resistant material disposed on the connecting through hole portion of the printed wiring circuit and covered by the insulating layer.

6. A printed wiring board as claimed in claim 2, wherein the sealing member is composed of a photosetting synthetic resin.

7. A printed circuit board comprising: an insulating substrate; a printed circuit on at least one surface of the substrate; an insulating layer on the printed circuit having a thickness of 20 to 50 μm; and an electromagnetic shielding layer on the insulating layer.

8. The printed circuit board according to claim 7, further comprising a hole in the substrate and a sealing member filling the hole and covered by the insulating layer.

9. The printed circuit board according to claim 8, wherein the sealing member comprises a thermosetting synthetic resin.

10. The printed circuit board according to claim 8, further comprising printed circuits on top and bottom surfaces of the substrate and wherein the sealing member comprises a conductive synthetic resin for connecting the printed circuits.

11. The printed circuit board according to claim 8, wherein the sealing member comprises a photosetting synthetic resin.

* * * * *